(12) United States Patent
Martin et al.

(10) Patent No.: US 8,461,019 B2
(45) Date of Patent: Jun. 11, 2013

(54) METHOD OF PROCESSING DEVICE WAFER

(75) Inventors: Devin Martin, Santa Clara, CA (US); Mark Brown, Santa Clara, CA (US)

(73) Assignee: Disco Corporation, Tokyo (JP)

( * ) Notice: Subject to any disclaimer, the term of this patent is extended or adjusted under 35 U.S.C. 154(b) by 162 days.

(21) Appl. No.: 13/185,942

(22) Filed: Jul. 19, 2011

(65) Prior Publication Data

US 2013/0023107 A1    Jan. 24, 2013

(51) Int. Cl.
*H01L 21/30* (2006.01)
*H01L 21/46* (2006.01)

(52) U.S. Cl.
USPC ............... 438/459; 438/455; 257/E23.02

(58) Field of Classification Search
USPC ........................................... 438/459
See application file for complete search history.

(56) References Cited

U.S. PATENT DOCUMENTS

| | | | |
|---|---|---|---|
| 6,949,158 B2* | 9/2005 | Ball et al. | 156/154 |
| 7,348,275 B2* | 3/2008 | Sekiya | 438/690 |
| 2003/0003688 A1* | 1/2003 | Tandy et al. | 438/459 |
| 2005/0064681 A1* | 3/2005 | Wood et al. | 438/459 |
| 2011/0097874 A1* | 4/2011 | Broekaart et al. | 438/459 |

FOREIGN PATENT DOCUMENTS

JP    2004-207606    7/2004

* cited by examiner

*Primary Examiner* — Daniel Whalen
(74) *Attorney, Agent, or Firm* — Greer, Burns & Crain, Ltd.

(57) ABSTRACT

A method of processing a device wafer includes the carrier wafer preparing step of preparing a carrier wafer including an excessive carrier region on a surface thereof which is disposed in a position corresponding to an excessive outer circumferential region on a surface of the device wafer, the recess forming step of forming a recess in the excessive carrier region the carrier wafer, after the recess forming step, the adhesive placing step of placing an adhesive in the recess so as to project from the surface of the carrier wafer, after the adhesive placing step, the wafer bonding step of bonding the surface of the carrier wafer and the surface of the device wafer to each other, thereby securing the device wafer to the carrier wafer with the adhesive, and after the wafer bonding step, the thinning step of thinning the device wafer to a predetermined thickness by grinding or polishing a reverse side of the device wafer.

4 Claims, 12 Drawing Sheets

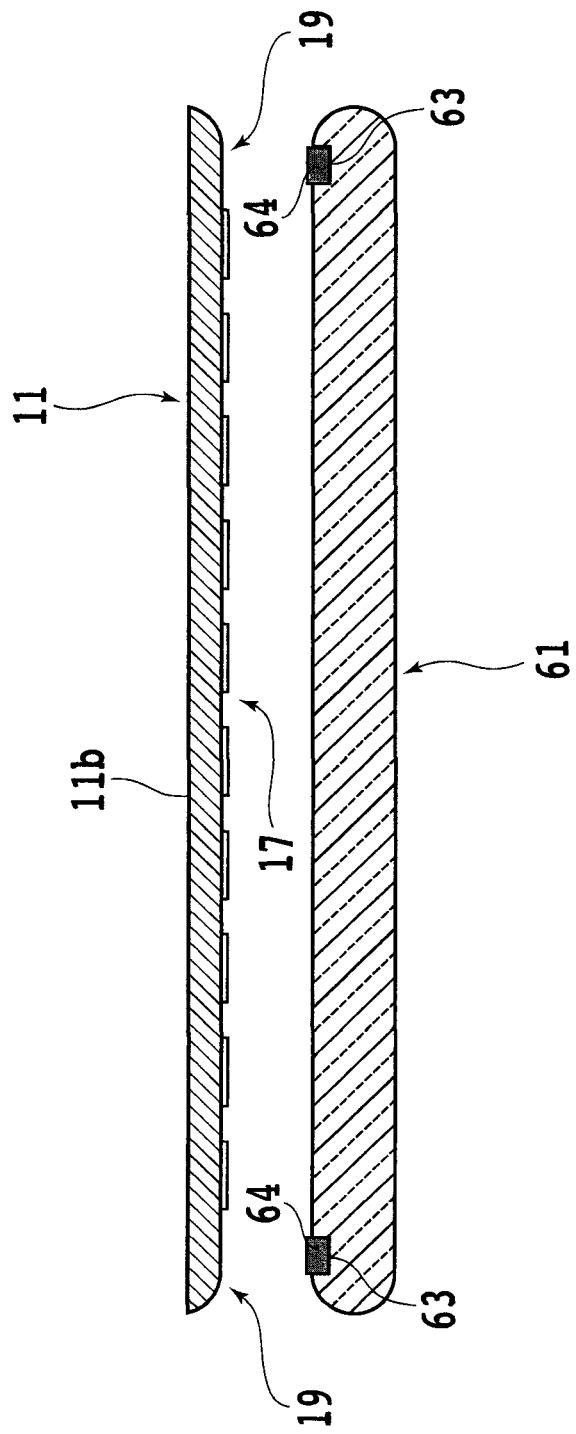

METHOD OF PROCESSING DEVICE WAFER

BACKGROUND OF THE INVENTION

1. Field of the Invention

The present invention relates to a method of processing a semiconductor device wafer, and more particularly to the art of facilitating the handling of a thinned semiconductor device wafer.

2. Description of the Related Art

For processing a device wafer (also referred to as "wafer") having a plurality of devices on its surface, such as a semiconductor device wafer, an optical device wafer, or the like, it has been customary to thin the wafer by grinding the reverse side thereof to a thickness of 50 μm or smaller.

Wafers that have a thickness of 50 μm or smaller are much more difficult to handle than thicker wafers. For example, those thin wafers tend to chip in their outer circumferential edges and to decrease greatly in rigidity when they are being handled.

There is known a technology for grinding the reverse side of a semiconductor device wafer whose surface (device surface) is bonded by an adhesive or the like to a carrier wafer (also referred to as a support wafer or a support plate) of glass or silicon.

SUMMARY OF THE INVENTION

Generally, the surface of a semiconductor device wafer includes minute concavities and convexities which belong to devices on the semiconductor device wafer. After the semiconductor device wafer has been peeled off the carrier wafer, it is highly tedious and time-consuming to completely remove the adhesive that have been caught by the concavities and convexities. In addition, it is not feasible to apply an adhesive to the device surface of wafers with MEMS (Micro Electro Mechanical Systems) devices including movable parts and minute fragile structures and optical device wafers with devices such as CMOS (Complementary Metal Oxide Semiconductors), CCDs (Charge-Coupled Devices), or the like, which are liable to suffer a reduction in pixel quality, resulting in device failures if foreign matter is applied to the device surface.

Furthermore, after a TSV (Through-Silicon Via) wafer with through electrodes has been thinned by grinding, it is processed in high-temperature processes including an insulating film forming process required by the formation of the through electrodes, a reflow process, and other processes. If adhesive glue is left on the device surface after the high-temperature processes, then it tends to cause device failures.

It is an object of the present invention to provide a method of processing a device wafer to prevent itself from suffering device failures or defects due to the deposition of an adhesive thereon.

In accordance with an aspect of the present invention, there is provided a method of processing a device wafer having a device region including a plurality of crossing division lines on a front surface thereof and a plurality of devices formed in respective areas that are sectioned by the division lines, and an excessive outer circumferential region surrounding said device region, comprising: a carrier wafer preparing step of preparing a carrier wafer to which said device wafer is to be bonded, said carrier wafer including an excessive carrier region on a surface thereof which is disposed in a position corresponding to said excessive outer circumferential region of said device wafer; a recess forming step of forming a recess in said excessive carrier region on a front surface of said carrier wafer; after performing said recess forming step, an adhesive placing step of placing an adhesive in said recess so as to project from the front surface of said carrier wafer; after performing said adhesive placing step, a wafer bonding step of bonding the front surface of said carrier wafer and the front surface of said device wafer to each other, thereby fixing said device wafer to said carrier wafer with said adhesive; and after performing said wafer bonding step, a thinning step of thinning said device wafer to a predetermined thickness by grinding or polishing a rear surface of said device wafer.

According to the present invention, since the adhesive placed in the recess of the carrier wafer is bonded to the excessive outer circumferential region of the device wafer, the deposition of the adhesive on the device region can be prevented. Thus, device failures or defects due to the deposition of the adhesive on the device surface can be prevented.

Preferably, the amount of the adhesive placed in the recess in the adhesive placing step is set such that the adhesive stays out of the device region in the wafer bonding step.

Preferably, the method further includes after the thinning step, a peeling step of peeling the carrier wafer from the device wafer. Preferably, the method further includes after the thinning step and before the peeling step, an additional processing step of additionally processing the device wafer which is bonded to the carrier wafer.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 11 is a cross-sectional view illustrating a peeling step;

DETAILED DESCRIPTION OF THE PREFERRED EMBODIMENT

Figure 1:
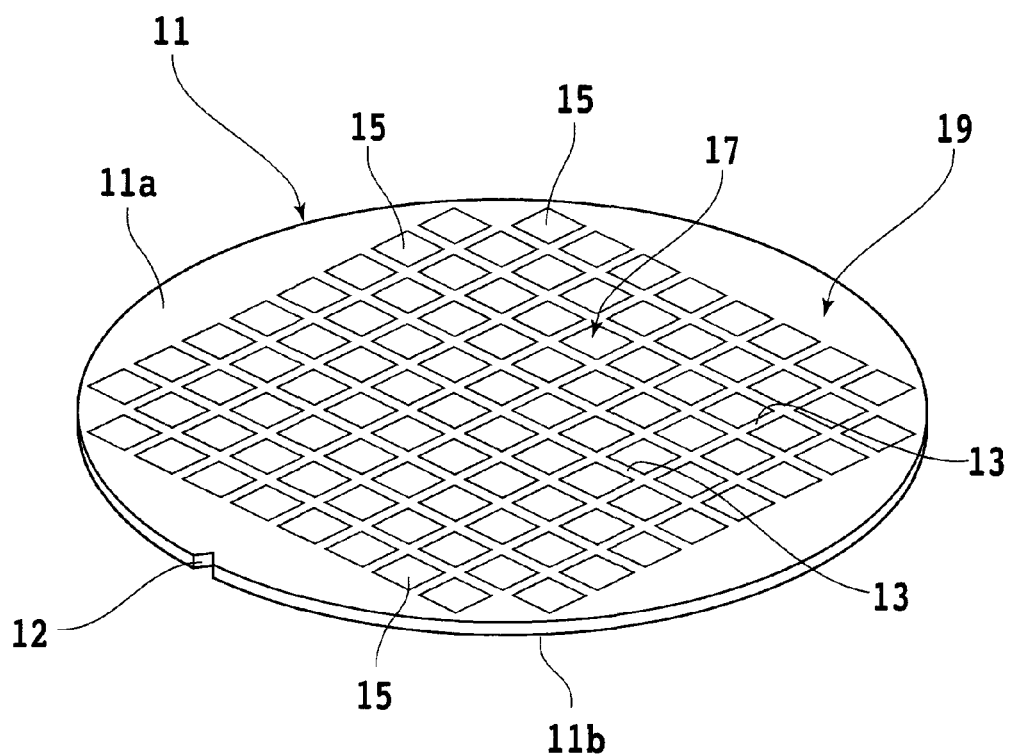
FIG. 1 is a perspective view of a device wafer.

A method of processing a semiconductor device wafer (hereinafter also referred to as "device wafer" or "wafer") according to an embodiment of the present invention will be described in detail below with reference to the drawings. As shown in FIG. 1, a device wafer 11 includes a silicon wafer having a thickness of 700 μm. The device wafer 11 has a plurality of division lines (streets) 13 arranged in a grid pattern on a surface 11a thereof and a plurality of devices 15 disposed in respective areas that are defined by the division lines 13. The devices 15 should preferably, but not necessarily, be any of various devices including MEMS devices including movable parts and minute fragile structures, CMOSs, CCDs, etc. The device wafer 11 includes a device region 17 where the devices 15 are positioned and an excessive outer circumferential region 19 surrounding the device region 17. The device wafer 11 also has a notch 12 defined in the outer circumferential thereof as a mark indicative of the crystalline orientation of the silicon wafer.

Figure 2:
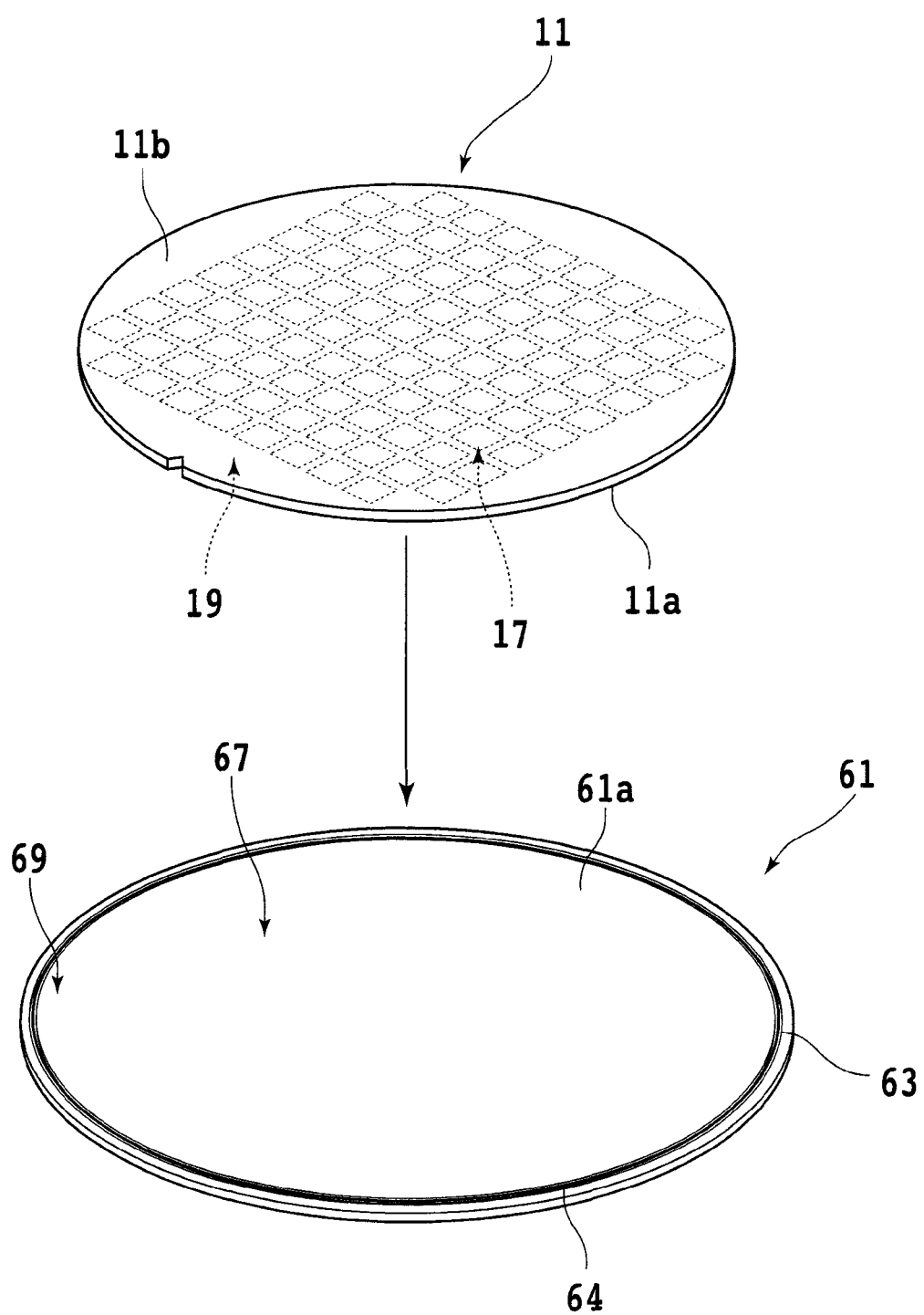
FIG. 2 is a perspective view illustrating a wafer bonding step.

The method of processing a semiconductor device wafer according to the present invention includes a carrier wafer preparing step to prepare a carrier wafer 61 shown in FIG. 2 for preventing the device wafer 11 from chipping at the time it is thinned to a thickness of, for example, 50 μm or smaller in a thinning step to be described later, and also preventing the device wafer 11 from suffering failures or defects due to a reduction in the rigidity thereof. The carrier wafer 61 includes a disk-shaped member having a surface 61a to which the surface 11a of the device wafer 11, turned upside down, will be bonded. The surface 61a of the carrier wafer 61 includes a device coverage region 67 corresponding to the device region 17 of the device wafer 11 and covering the device region 17 when the surface 11a of the device wafer 11 is bonded to the surface 61a of the carrier wafer 61, and an excessive carrier region 69 surrounding the device coverage region 67. When the device wafer 11 is positioned in coaxially facing relation to the carrier wafer 61, the excessive carrier region 69 is aligned with the excessive outer circumferential region 19. The carrier wafer 61 is made of a material such as silicon, glass, ceramics, metal (e.g., stainless steel), synthetic resin, or the like. The carrier wafer 61 stably supports the device wafer 11 which has been thinned to a thickness of, for example, 50 μm or smaller in the thinning step described later.

As described above, the carrier wafer preparing step is carried out to prepare the carrier wafer 61 to which the device wafer 11 will be bonded and which includes the excessive carrier region 69 which will be aligned with the excessive outer circumferential region 19 of the device wafer 11.

Figure 3:
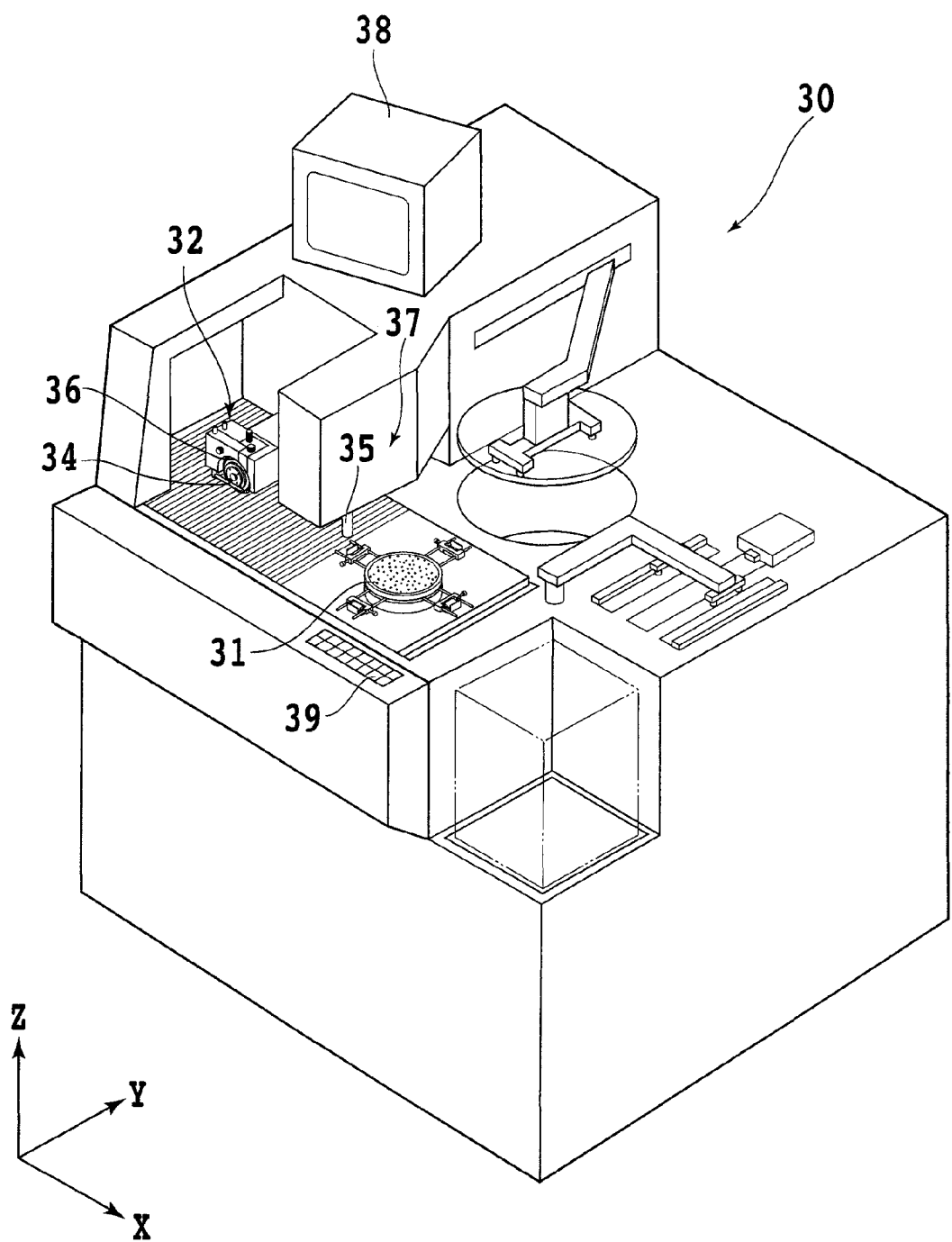
FIG. 3 is a perspective view showing an appearance of a cutting apparatus.
Figure 4:
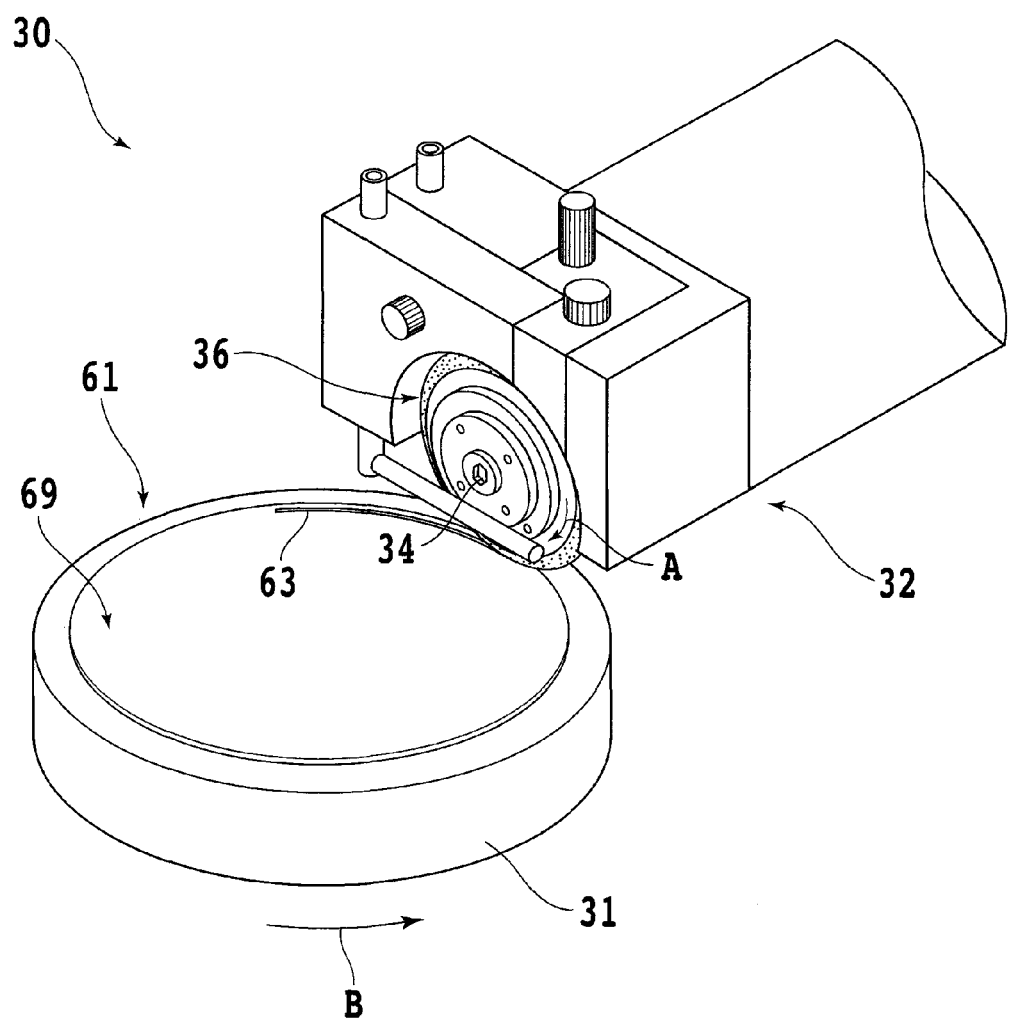
FIG. 4 is a perspective view illustrating a recess forming step carried out by the cutting apparatus.
Figure 5:
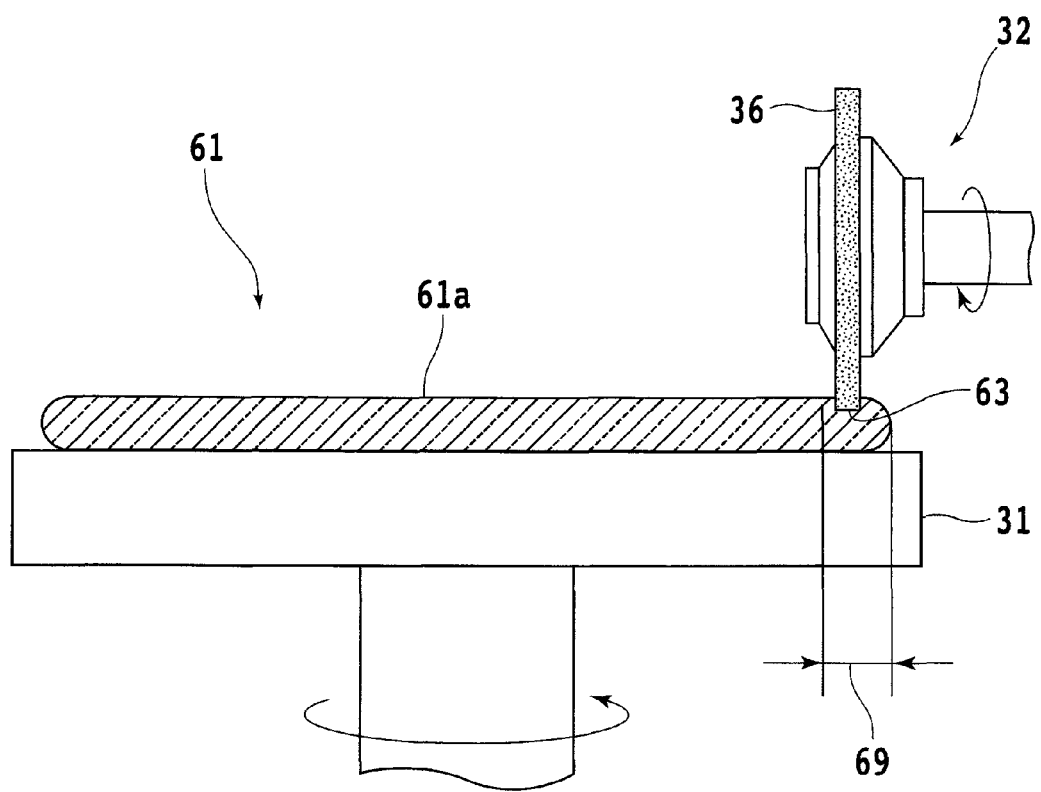
FIG. 5 is a sectional side elevational view illustrative of the recess forming step carried out by the cutting apparatus.

Then, the excessive carrier region 69 of the carrier wafer 61 thus prepared is cut by a cutting apparatus 30 shown in FIG. 3, for example, to carry out a recess forming step to form an annular groove 63 as a recess in the excessive carrier region 69 on the surface 61a of the carrier wafer 61. The cutting apparatus 30 includes a chuck table 31 rotatable about its own axis and movable back and forth in X-axis directions, and a cutting unit 32 movable back and forth in Y-axis directions and Z-axis directions. As shown in FIG. 4, the cutting unit 32 includes a cutting blade 36 mounted on the distal end of a spindle 34. The cutting blade 36 is rotatable at a high speed in the direction indicated by the arrow A by a motor, not shown. The chuck table 31 holds the carrier wafer 61 under suction, and is rotatable about its own axis in the direction indicated by the arrow B by a motor, not shown. As shown in FIG. 5, the cutting blade 36 is moved downwardly in the position of the excessive carrier region 69, and the cutting blade 36 is held in contact with the surface 61a of the carrier wafer 61. While the cutting blade 36 is rotating about its own axis, the chuck table 31 is rotated about its own axis to make at least one revolution, thereby forming a continuous annular groove 63 in the excessive carrier region 69.

As shown in FIG. 3, the cutting apparatus 30 also includes an alignment mechanism 37 having an image capturing unit 35, a display monitor 38 for displaying images captured by the image capturing unit 35, and a console panel 39 operable by the operator to enter necessary items of information into the cutting apparatus 30. The cutting apparatus 30 is capable of not only forming the annular groove 63, but also cutting the device wafer 11 along the division lines 13 shown in FIG. 1. In the illustrated embodiment, the annular groove 63 is formed as a recess in the excessive carrier region 69 by the cutting apparatus 30 shown in FIG. 3. However, a plurality of bottomed holes may be formed in the excessive carrier region 69 by an etching apparatus or another apparatus, for example. Consequently, the recess that is formed in the excessive carrier region 69 is not limited to the annular groove 63.

Figure 6:
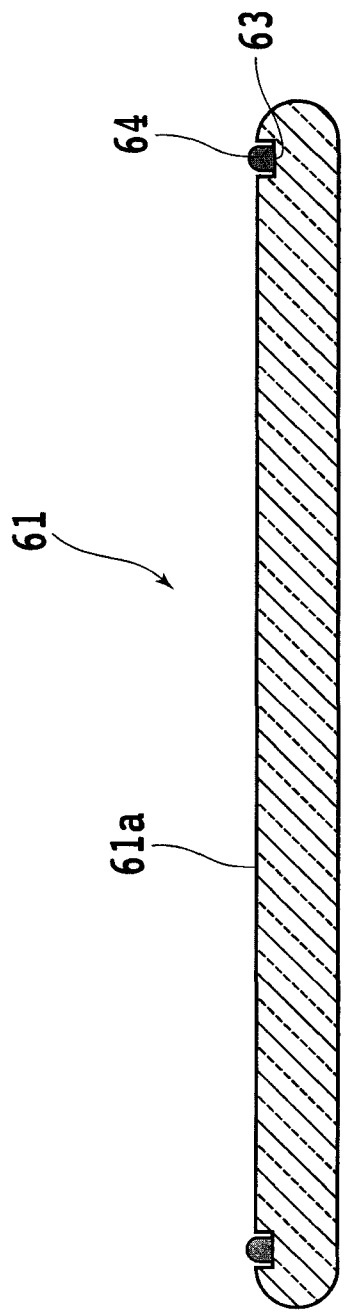
FIG. 6 is a cross-sectional view of a carrier wafer after an adhesive placing step has been carried out thereon.

After the recess forming step is carried out to form the annular groove 63, an adhesive placing step of the method is carried out to place an adhesive 64 in the annular groove 63 so as to project from the surface 61a of the carrier wafer 61, as shown in FIG. 6. The adhesive 64 is of a material selected depending on the material of the carrier wafer 61, and is not limited to any materials. However, the adhesive 64 should preferably, but not necessarily, be a thermosetting resin adhesive such as an epoxy adhesive, for example. The adhesive 64 may be placed in the annular groove 63 by a coating process or may be prepared as an annular form in advance and inserted in the annular groove 63. Therefore, the adhesive 64 may be placed in the annular groove 63 by any of various processes.

Figure 7:
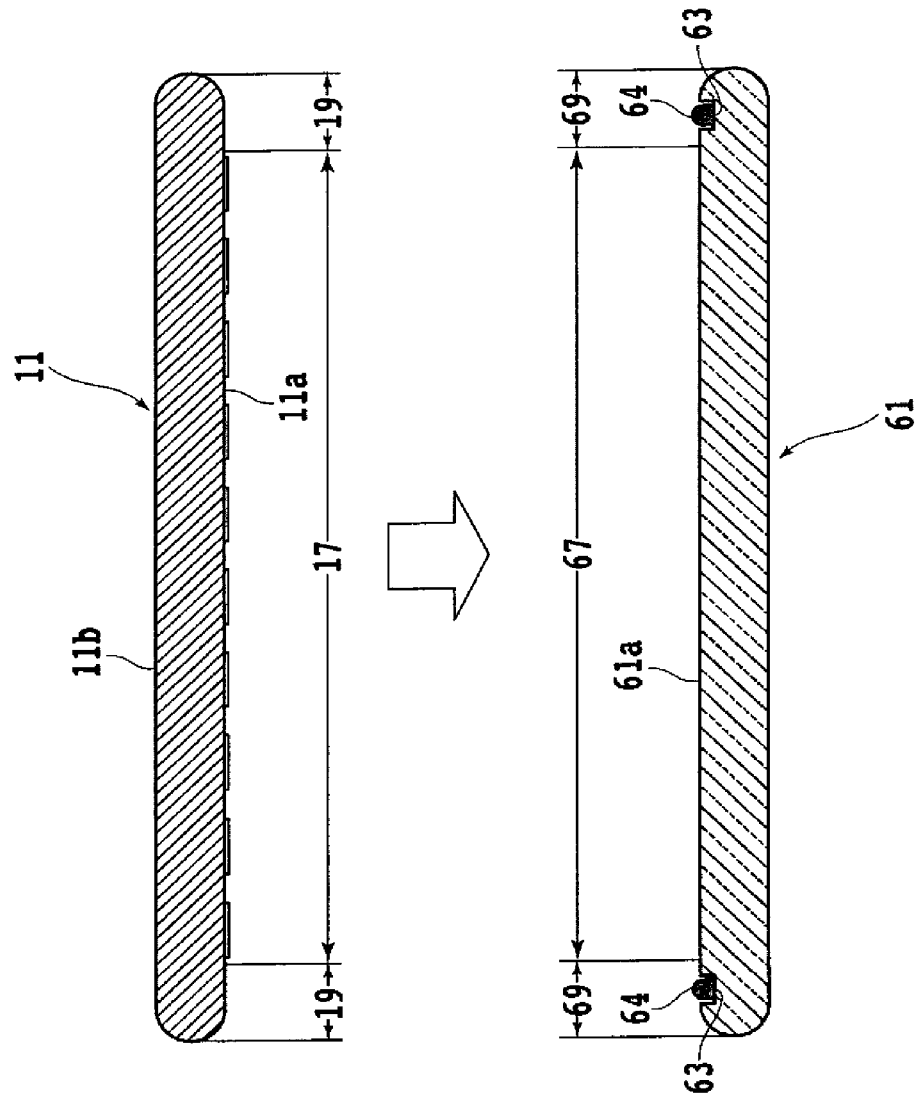
FIG. 7 is a cross-sectional view illustrating the wafer bonding step.
Figure 8:
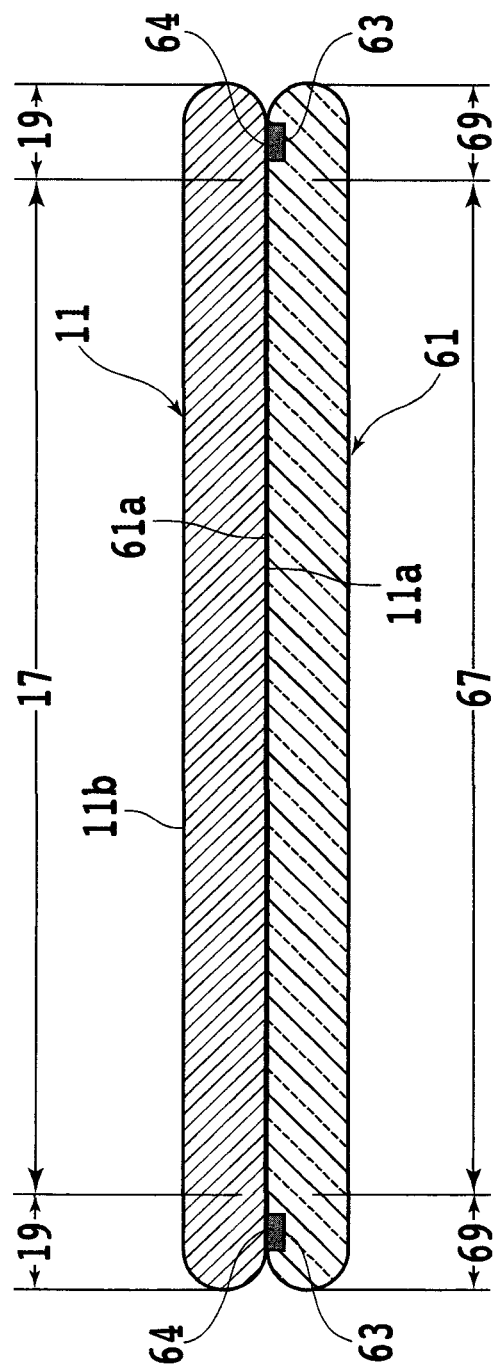
FIG. 8 is a cross-sectional view of the device wafer and the carrier wafer which have been bonded to each other.

The adhesive 64 is placed in the annular groove 63 so as to have its upper end project from the surface 61a of the carrier wafer 61. As shown in FIG. 7, when the device wafer 11 is turned upside down and moved to bring the surface 11a closely to the surface 61a of the carrier wafer 61, the excessive outer circumferential region 19 of the device wafer 11 is brought into contact with the adhesive 64 which projects from the surface 61a of the carrier wafer 61. Then, as shown in FIG. 8, the excessive outer circumferential region 19 of the device wafer 11 and the excessive carrier region 69 of the carrier wafer 61 are joined to each other by the adhesive 64. In this manner, a wafer bonding step of the method is carried out to bond the surface 61a of the carrier wafer 61 and the surface 11a of the device wafer 11 to each other, securing the device wafer 11 to the carrier wafer 61 with the adhesive 64 as shown in FIG. 8.

The amount of the adhesive 64 which is placed in the annular groove 63 in the adhesive placing step should preferably be such that the adhesive 64 does not reach, i.e., stays out of, the device region 17 of the device wafer 11 (or the device coverage region 67 of the carrier wafer 61) when the wafer bonding step is carried out, i.e., when the device wafer 11 is secured to the carrier wafer 61 with the adhesive 64 as shown in FIG. 8. Stated otherwise, the adhesive 64 which is placed in the annular groove 63 in the adhesive placing step should preferably remain in the excessive outer circumferential region 19 of the device wafer 11 (or the excessive carrier region 69 of the carrier wafer 61), or more preferably be kept within the annular groove 63 without overflowing it, when the wafer bonding step is carried out, i.e., when the device wafer 11 is secured to the carrier wafer 61 with the adhesive 64 as shown in FIG. 8. With the amount of the applied adhesive 64 being thus selected, the adhesive 64 is prevented from reaching the device region 17 of the device wafer 11 and hence from being applied to any of the devices 15 in the device region 17. In other words, the adhesive 64 stays within the excessive outer circumferential region 19 of the device wafer 11 (or the excessive carrier region 69 of the carrier wafer 61). If the amount of the adhesive 64 which is placed in the annular groove 63 in the adhesive placing step is small enough to keep the adhesive 64 within the annular groove 63 without overflowing it when the wafer bonding step is carried out, then the adhesive 64 is securely prevented from being applied to the devices 15 in the device region 17. Since the adhesive 64 which is placed in the annular groove 63 is held in contact with the excessive outer circumferential region 19 of the device wafer 11, the adhesive 64 is also securely prevented from being applied to the device region 17. Therefore, the device wafer 11 is prevented from suffering failures or defects which would otherwise be caused by the deposition of the adhesive 64 on the device region 17.

Figure 9:
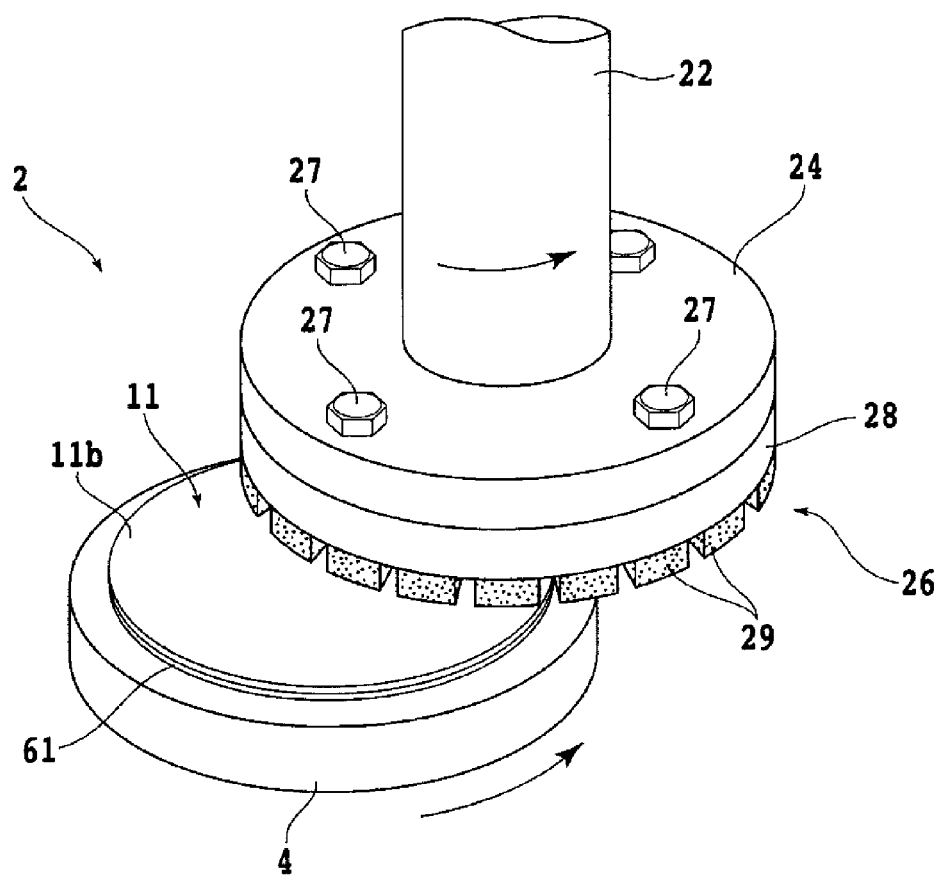
FIG. 9 is a perspective view illustrating a thinning step.

After the wafer bonding step, a thinning step of the method is carried out to grind or polish a reverse side 11b of the device wafer 11 that is integrally combined with the carrier wafer 61, to a predetermined thickness. The thinning step is carried out by a grinding apparatus 2 shown in FIG. 9. The grinding apparatus 2 includes a chuck table 4 and a spindle 22 with a wheel mount 24 fixed to a lower distal end thereof, and a grinding wheel 26 is mounted on the wheel mount 24 by screws 27. The grinding wheel 26 includes an annular base 28 and a plurality of spaced grinding stones 29 fixed to a lower free end of the annular base 28. Each of the grinding stones 29 includes abrasive grains of diamond, each having a diameter in the range from 0.3 to 1.0 μm, glued together by a vitrified bond or the like.

Figure 10:
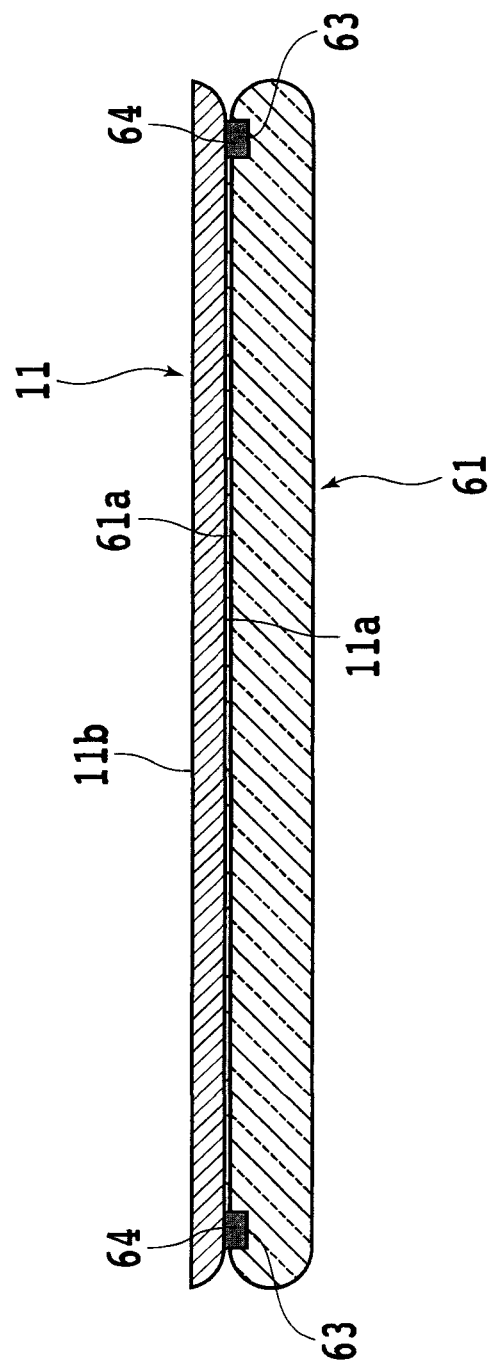
FIG. 10 is a cross-sectional view of the device wafer bonded to the carrier wafer after the thinning step.

In the thinning step, the device wafer 11 is ground or polished while it is being firmly supported by the carrier wafer 61 which is rigid. Consequently, the device wafer 11 is prevented from warping and/or chipping in its outer circumferential edge. FIG. 10 shows the device wafer 11 which is bonded to the carrier wafer 61 after the thinning step. After the thinning step, the reverse side 11b of the device wafer 11 may be polished to remove any strains which may have been developed by the grinding of the reverse side 11b in the thinning step.

Then, as shown in FIG. 11, a peeling step of the method is carried out to peel the carrier wafer 61 which has been thinned by the thinning step, from the device wafer 11. When the peeling step is carried out, the device wafer 11 is separate from the carrier wafer 61. The devices 15 on the peeled-off device wafer 11 are free of the adhesive 64. As the adhesive 64 is not applied as foreign matter to the devices 15, the devices 15 are prevented from suffering from failures or defects which would otherwise be caused by the deposition of the adhesive 64 on the devices 15. In the peeling step, a suitable parting agent depending on the type of the adhesive 64 is used, if necessary, to separate the device wafer 11 from the carrier wafer 61.

Figure 12A:
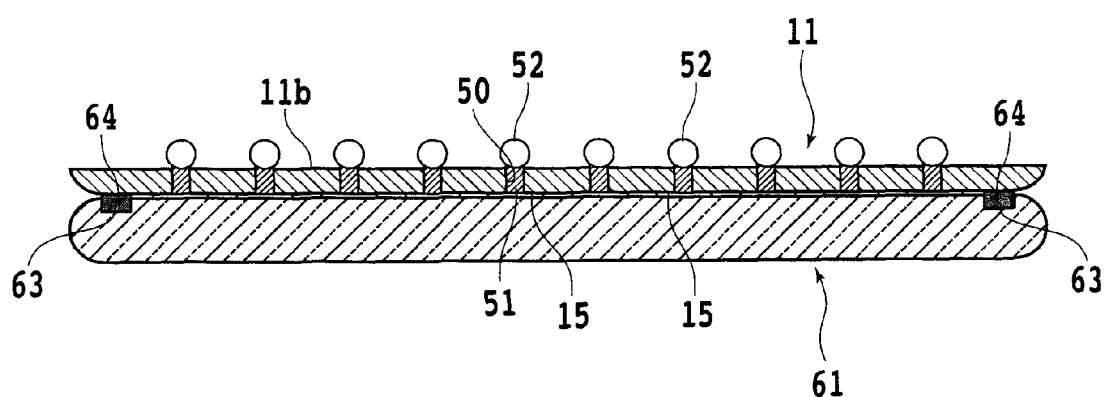
FIG. 12A is a cross-sectional view illustrating an additional processing step.

After the thinning step and before the peeling step, it is possible to carry out an additional processing step to additionally process the device wafer 11 bonded to the carrier wafer 61 to form through electrodes, for example, as shown in FIG. 12A. In the additional processing step, a through electrode forming mask is formed on the reverse side 11b of the device wafer 11 by photolithography. Then, through holes 50 are formed in the device wafer 11 by dry etching or laser beam application. Thereafter, an insulating film and a barrier metal are deposited on the inner surface of each of the through holes 50. After a photoresist is removed, each of the through holes 50 is filled with copper to form a through electrode 51 therein. Then, the reverse side 11b of the device wafer 11 is planarized by a CMP (Chemical Mechanical Polishing) process, after which a wet or dry etching process is performed on the reverse side 11b of the device wafer 11 to make end faces of the through electrodes 51 project from the reverse side 11b of the device wafer 11. Then, ball-like bumps 52 are formed on the respective projecting end faces of the through electrodes 51 by a reflow process.

Figure 12B:
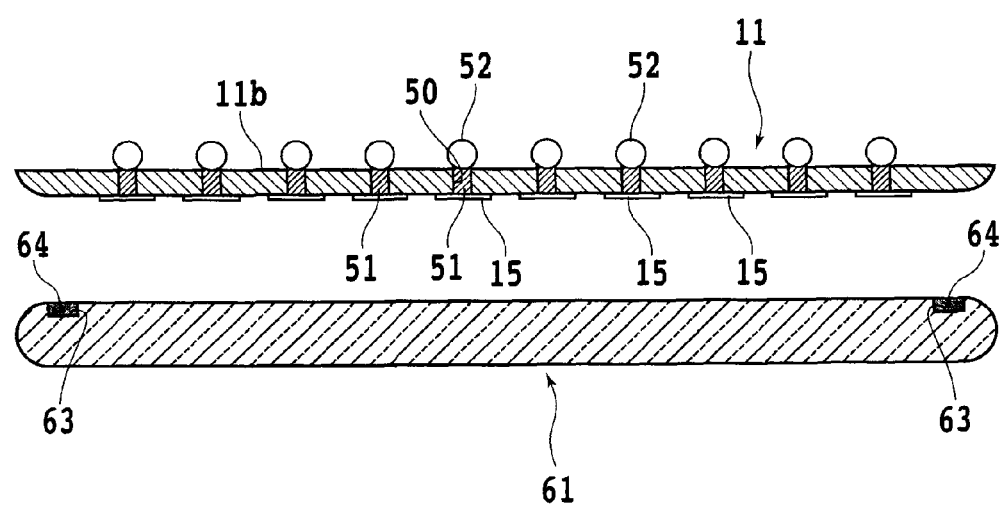
FIG. 12B is a cross-sectional view illustrating a peeling step after the additional processing step has been performed on a wafer.

Thereafter, as shown in FIG. 12B, the peeling step is carried out to peel the carrier wafer 61 from the device wafer 11. As described above, even when high-temperature processes including an insulating film forming process, a reflow process, and other processes are carried out in the process of forming through electrodes in the device wafer 11 (e.g., a TSV wafer), since the adhesive 64 is not applied to the devices 15, the adhesive 64 is prevented from being deposited as foreign matter on the devices 15, and hence the devices 15 are prevented from suffering from failures or defects which would otherwise be caused by the deposition of the adhesive 64 on the devices 15.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a device wafer having a device region including a plurality of crossing division lines on a front surface thereof and a plurality of devices formed in respective areas that are sectioned by the division lines, and an excessive outer circumferential region surrounding said device region, comprising:
   a carrier wafer preparing step of preparing a carrier wafer to which said device wafer is to be bonded, said carrier wafer including an excessive carrier region on a surface thereof which is disposed in a position corresponding to said excessive outer circumferential region of said device wafer;
   a recess forming step of forming a recess in said excessive carrier region on a front surface of said carrier wafer;
   after performing said recess forming step, an adhesive placing step of placing an adhesive in said recess so as to project from the front surface of said carrier wafer;
   after performing said adhesive placing step, a wafer bonding step of bonding the front surface of said carrier wafer and the front surface of said device wafer to each other, thereby fixing said device wafer to said carrier wafer with said adhesive; and
   after performing said wafer bonding step, a thinning step of thinning said device wafer to a predetermined thickness by grinding or polishing a rear surface of said device wafer.

2. The method according to claim 1, wherein the amount of said adhesive placed in said recess in said adhesive placing step is set such that said adhesive stays out of said device region in said wafer bonding step.

3. The method according to claim 1, further comprising:
   after performing said thinning step, a peeling step of peeling said carrier wafer from said device wafer.

4. The method according to claim 3, further comprising:
   after performing said thinning step and before said peeling step, an additional processing step of additionally processing said device wafer which is bonded to said carrier wafer.

* * * * *